United States Patent [19]

Mott et al.

[11] 4,388,010

[45] Jun. 14, 1983

[54] FONT MODULE FOR MATRIX PRINTER

[75] Inventors: William E. Mott, Versailles; Iraj D. Shakib, Lexington, both of Ky.

[73] Assignee: International Business Machines Corporation, Armonk, N.Y.

[21] Appl. No.: 221,694

[22] Filed: Dec. 31, 1980

[51] Int. Cl.[3] ........................ B41J 29/02; H05K 1/00; H05K 5/00; G11C 5/02

[52] U.S. Cl. .................................. 400/692; 339/17 C; 361/395; 361/399; 365/51; 365/52; 400/67; 400/121

[58] Field of Search .............................. 400/61, 67-69, 400/121-126, 692, 303, 306; 339/17 C; 364/706, 708; 361/394, 395, 399; 365/51, 52, 63

[56] References Cited

U.S. PATENT DOCUMENTS

| | | | |
|---|---|---|---|
| 3,702,464 | 11/1972 | Castrucci | 340/173 |
| 4,095,791 | 6/1978 | Smith et al. | 361/399 X |
| 4,169,684 | 10/1979 | Blom | 400/124 |
| 4,216,522 | 8/1980 | Slagel et al. | 361/392 |
| 4,227,238 | 10/1980 | Saito | 339/17 C X |

FOREIGN PATENT DOCUMENTS

| | | | |
|---|---|---|---|
| 2900438 | 7/1980 | Fed. Rep. of Germany | 400/144.2 |

*Primary Examiner*—Paul T. Sewell

*Attorney, Agent, or Firm*—John A. Brady; George E. Grosser

[57] ABSTRACT

A replaceable font module for a printer includes an interrogable storage containing information representing graphic patterns and is connected to cooperate with a printer upon insertion within a corresponding receptacle. The module and receptacle are configured to allow insertion without intense operator attention by virtue of a camming surface on the module that cooperates with a hook-like latch of the receptacle to provide an undulating but positive latching motion in response to a simple operator insertion motion. As a part of the latching motion, a wiping action to assure a high quality contact with conductor pads on the module that provide a transfer point for the communication path to the storage.

14 Claims, 6 Drawing Figures

FONT MODULE FOR MATRIX PRINTER

BACKGROUND OF THE INVENTION

1. Technical Field of the Invention

The present invention relates to matrix printers and more specifically to replaceable assemblies containing retrievably stored font information for printing patterns such as characters.

2. Art Statement

Various replaceable devices that incorporate retrievable data or computer instructions are known. Also replaceable circuit boards including font storage for a matrix printer. Typically, however, the replacement has been inconvenient particularly for persons unfamiliar with "hook up" of electrical assemblies. Also, the replaceable devices have tended to have projecting contacts that are vulnerable to being caught and damaged causing them to require special handling and storage.

BRIEF SUMMARY OF THE INVENTION

A replaceable font storage module is adapted to be conveniently connected with a corresponding receptacle. By converting a simple operator insertion motion to a more complex motion through the use of camming surfaces, positive latching is achieved and a wiping motion is caused to occur between the external contacts of the module and receptacle to provide a high quality electrical connection. The external contacts of both the module and receptacle are recessed to prevent mechanical injury and to reduce the likelihood of encountering static discharges that might injure electronic components. A spring, energized by the above-mentioned camming action, brings the respective contacts into alignment with a reciprocating motion that provides the desired contact wiping. In conjunction with the reciprocating motion, the spring serves as a pivot about which the module rotates between an insertion position to a latched position.

By providing, moreover, an insertion end of the module with an assymetrical cross-section reversed insertions are avoided.

With the module and receptacle of the invention, desirable office environment characteristics such as durability and ease of use are achieved. The operator, who may be unfamiliar with electrical apparatus, is largely isolated from the usual incidents of electrical assembly.

BRIEF DESCRIPTION OF THE DRAWING

A presently preferred implementation of the invention will be described in detail with reference to the figures wherein:

Referring to FIG. 1, a font module 8 for use in a matrix printer includes a circuit board 10 with an information storage device 12 mounted thereto. The storage device 12 is preferably a semiconductor read-only-memory (ROM) with logic for receiving information requests and responding by interrogating the stored information and outputting that information as is well known in the art. Stored in the storage device 12 is information representing patterns for marks to be formed during printing operations. Preferably, address data and timing signals as well as operating power are multiplexed to require four input/output parts of terminals 14.

Figure 2:
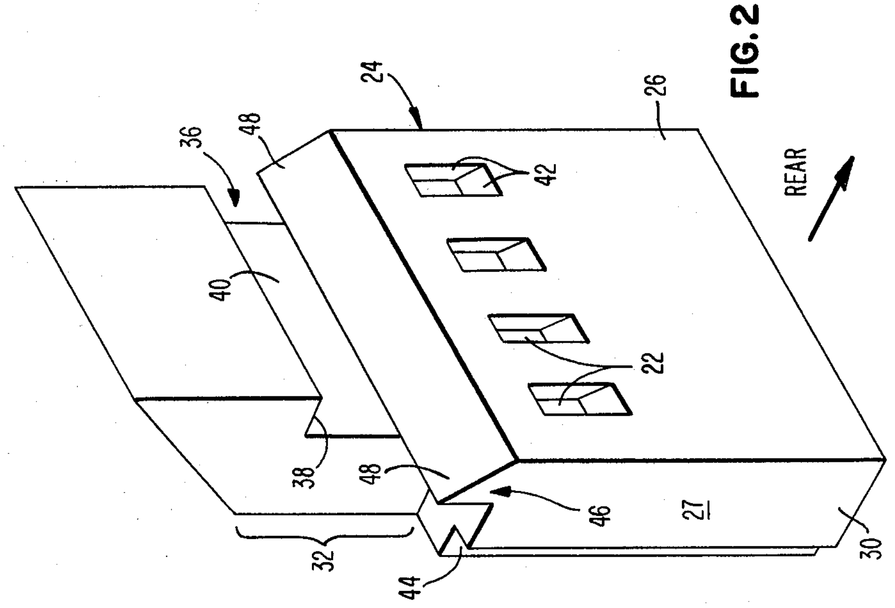
FIG. 2 is a perspective view of the presently preferred font module from a different view point than FIG. 1.

Various multiplexing techniques are well known in the art and protocol for information transfer is not considered to be a part of this invention. Indeed, as will be appreciated from the discussion below, the number of terminals 14 may be varied within reasonable limits without departing from the invention. From the terminals 14, conducting paths 18 printed on the circuit board 10 extend to corresponding self supporting conductor pins 20 having mounted at their ends a set of contact pads 22 (see also FIG. 2) which are preferably plated with a high quality contact material such as gold.

The above-described electrical assembly 23 are intended to be conveniently handled by an operator, as have been the type elements of traditional typewriters. To this end, a housing 24, that is electrically insulating, is formed around the electrical assembly 23 preferably by a single molding operation but a two section housing could be used and would have some advantages in facilitating the positioning of the electrical assembly 23 within.

The housing 24 is generally rectangular in shape having a first major surface 26 at what will be referred to as the rear of the module 8 and a second major surface 28 which is generally coextensive with and parallel to said first major surface and faces in the opposite direction. An insertion end surface 30 is preferably oriented to be perpendicular to the major surfaces 26 and 28. Two narrow side surfaces 25 and 27 connect the major surfaces 26 and 28 and are perpendicular to the insertion end surface 30.

A handle section 32 is arranged to be opposite the insertion end surface 30 and includes a legend surface 34 that is angled relative to the major surfaces 26 and 28. A cutaway portion 36 to the lower rear of the handle section 32 is adapted to accommodate a hood portion of a receptacle, discussed below, and is defined by a rectilinear surfaces 38 and 40.

The contact pads 22 are exposed in narrow recesses defined by slanted window-frame like surfaces 42. Preferably, the contact pads 22 are aligned in a row parallel to the insertion end surface 30.

Asymmetry to prevent reversed insertion of the font module 8 is achieved by forming notches 44 in one of the major surfaces 26 and 28 extending vertically from the insertion end surface 30. The cross sectional profile of the module 8 preferably presents no projections in progressing vertically from the insertion end surface 30 for the full intended insertion distance so as to permit a close fitting receptacle to be used. Preferably, two notches are formed at either side of the front facing major surface 28.

Camming to provide a special insertion motion and latching, as will be described in more detail below, are provided for by at least one but preferably two shoulder sections 46 that include a camming surface 48 that slopes from the first main surface 26 toward the second main surface and away from the insertion end surface. Each camming surface 48 terminates in a latching edge 50 as a result of a sharply angled cutaway defining a latching surface 54 that preferably is parallel to the major surfaces 26 and 28.

Figure 1:
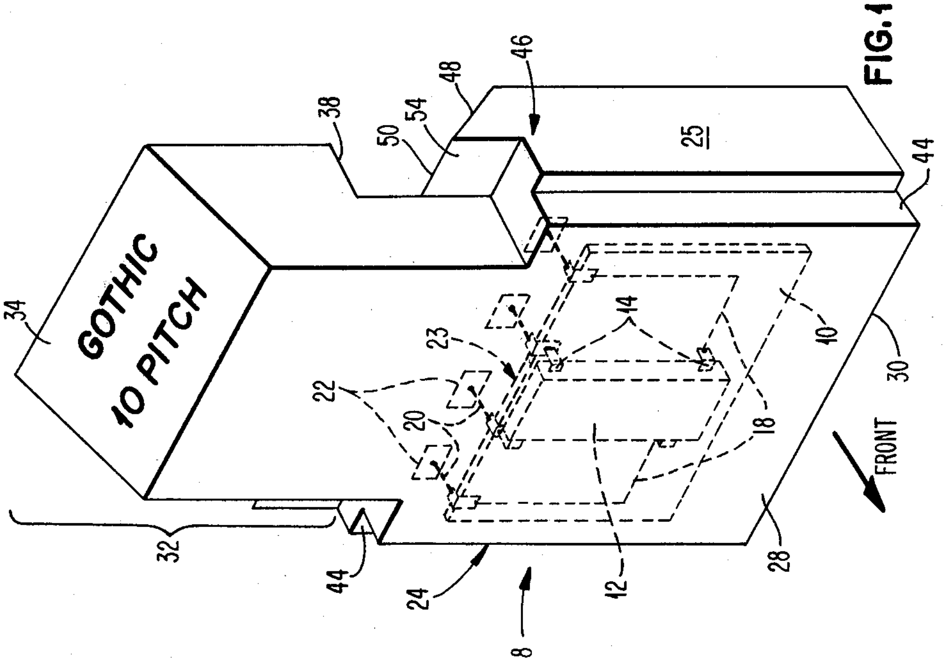
FIG. 1 is a perspective view of the presently preferred font module according to the invention with certain internal components indicated in dashed lines.
Figure 3:
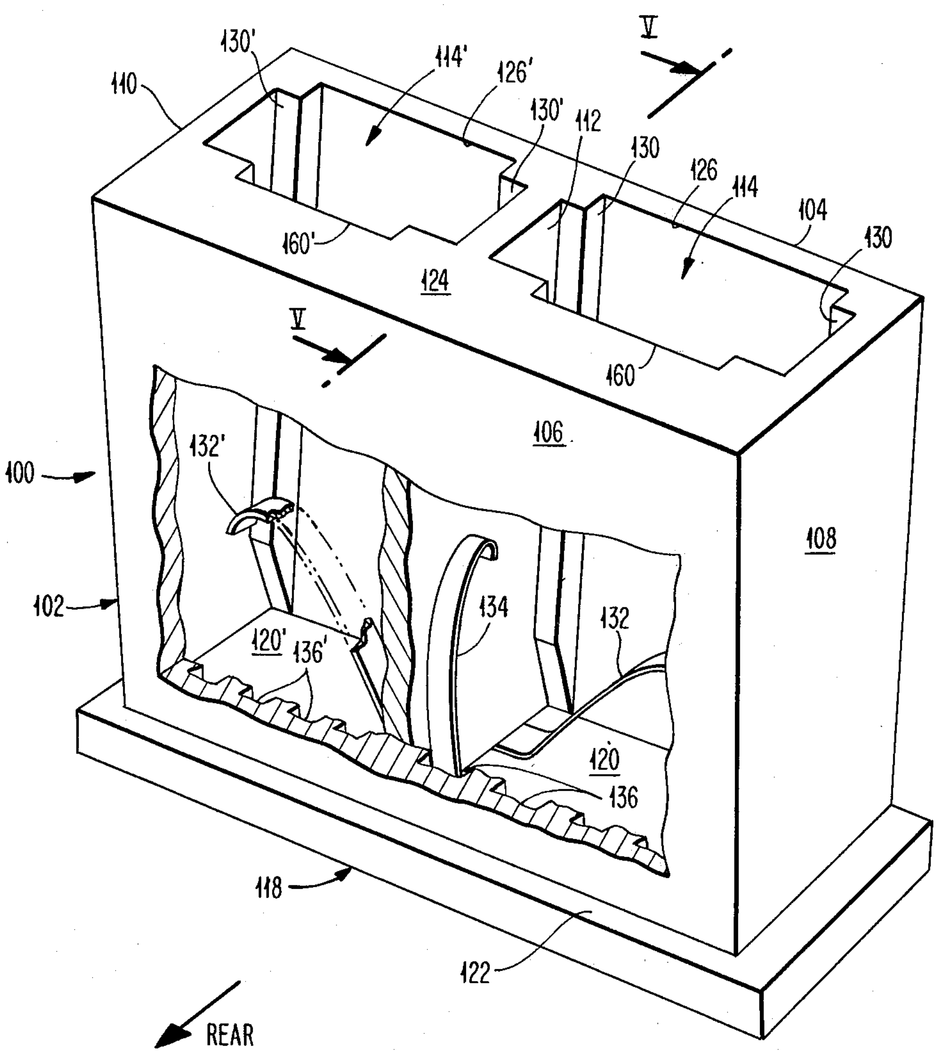
FIG. 3 is a perspective view of the presently preferred receptacle according to the invention with a cutaway portion.
Figure 4:
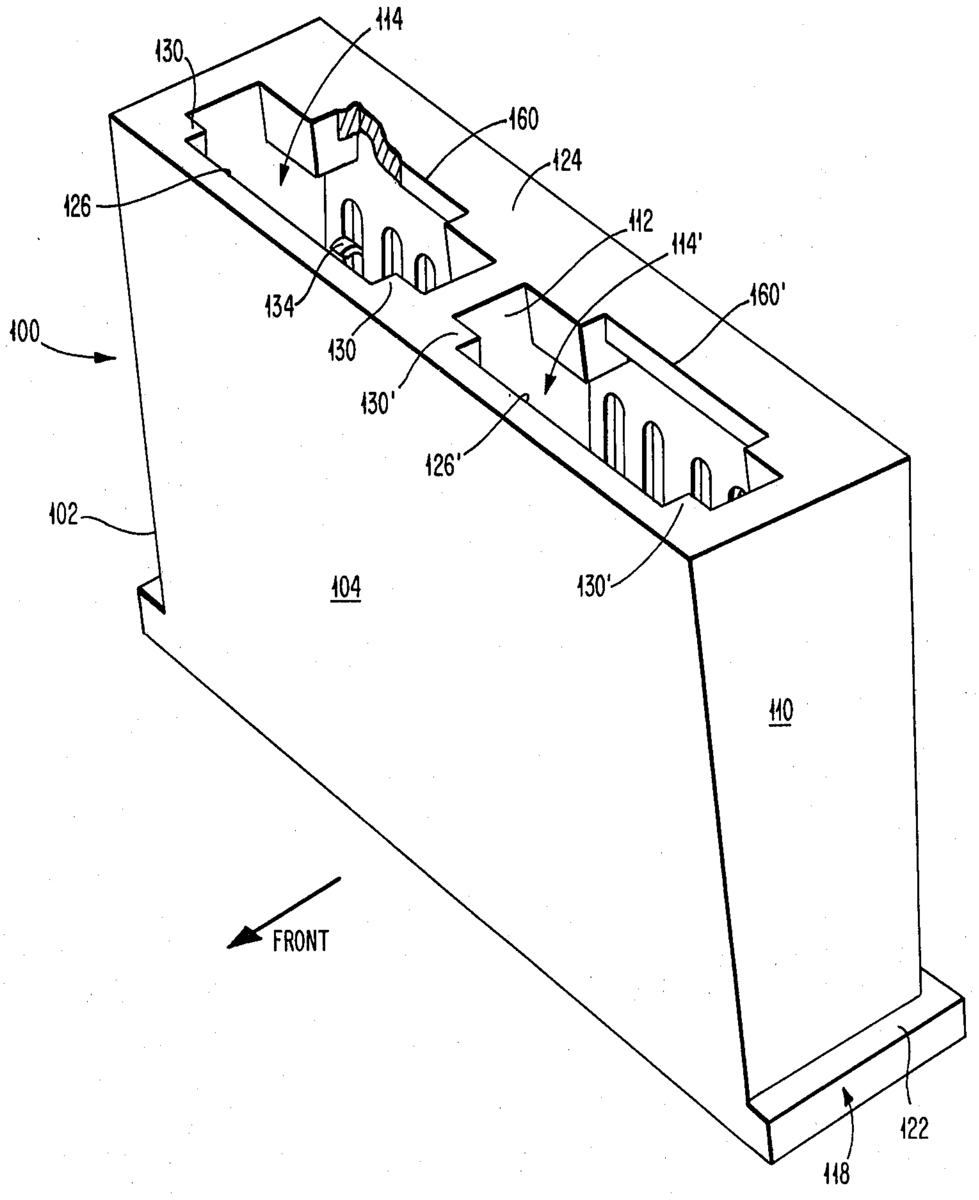
FIG. 4 is a perspective view of the presently preferred receptacle from a different view point than FIG. 3.

Referring to FIG. 3, a receptacle 100 has a body portion 102 that includes a sloped front wall 104 (see FIG. 4), a rear wall 106 and a pair of side walls 108 and 110. A center wall 112 serves to define two cavities 114 and 114' (comparable elements are identified using primes and will not be discussed separately) for individually receiving the modules 8 (see FIG. 1). A bottom panel 118 extends to provide a mounting flange 122 and receives a floor panel 120 for the cavity 114 which may be bonded in place.

A cover panel 124 defines an aperture 126 for receiving the module 8 (see FIGS. 1 and 2) and is shaped with corresponding asymmetry respective of the insertion end panel 30 to prevent reversed insertions. In particular, the ribs 130 are spaced to accommodate the width of the major surface 28.

A leaf spring 132 rises from the floor 120 of the cavity 114 and provides resilient resistance to insertion of one of the modules 8. Spring contacts 134 (only one of four is shown for the single cavity 114) are mounted in elongate grooves 136 (see also FIG. 5) on the inside of the rear wall 106 and extend forward of the wall at a position corresponding to the position of the pads 22 of the module 8 when in operative position (shown in FIG. 5 as a full line view, the initial insertion position being indicated in Phantom).

Figure 5:
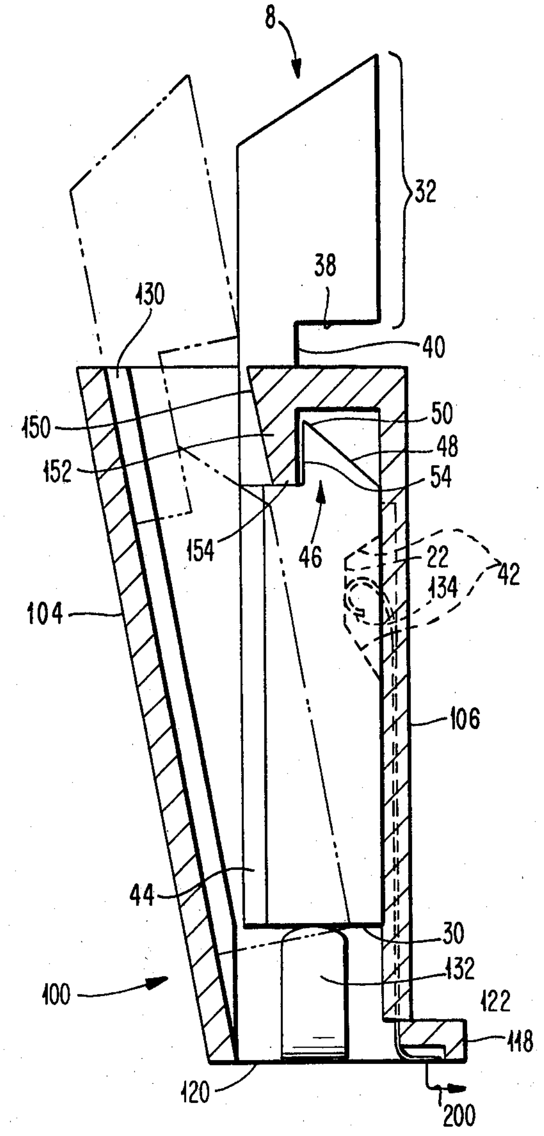
FIG. 5 is a cross-section view taken along the line V—V indicated in FIG. 3.
Figure 6:
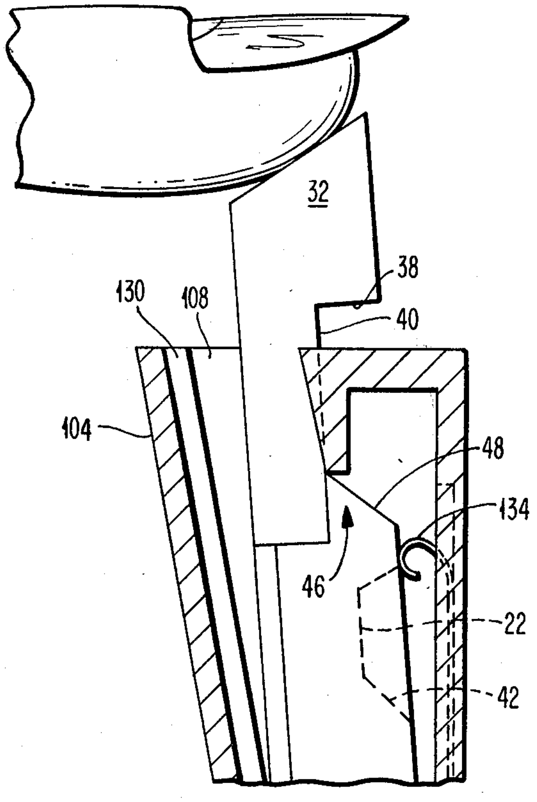
FIG. 6 is a partial cross-sectional view similar to that of FIG. 5.

The action of the module 8 during insertion within the receptacle 100 is best understood with regard to FIGS. 5 and 6.

The sloped front wall 104 and the sloped front surface 150 of a hook 152 define a gap that receives the font module 8 which enters easily until resisted by the spring 132. Rearward pressure by the operator results in camming action between camming surface 48 and a reference edge 154 of the hook 152 which drives the font module 8 to compress the spring 132. When the edge 50 is poised at reference edge 154 the spring contact 134 is above the pad 22 (see FIG. 6).

Further rearward pressure causes the edge 50 to go beyond the reference edge 154 releasing module 8 to be driven upward by the spring 132 into the latched position. The flexure of spring 132 not only serves to provide a reciprocating motion but also permits operation as a pivot for a slight rotation of the font module 8 from the insertion section to the operative or latching section (see FIGS. 5 and 6), a rotation that is blocked by the hook 152 without deformation of the spring 132. These two coincident motions provide for latching under the hook 152 (preferably there is a hook 152 for each shoulder section 46 of the module) and for wiping of contact 134 along the contact pad 22 to promote a high quality electrical connection. The electrical connection to the printer is preferably completed by a conductor 200 at the bottom of the spring 134.

As a special provision to limit operator awareness of and exposure to electrical contacts, a hood section 160 (see FIGS. 3 and 4) of the top surface 124 of receptacle 100 extends over the contacts 134 and is shaped to enter the cutaway portion 36 of the font module 8.

Removal of the font module 8 is conveniently achieved by a downward pressure to move the edge 50 below the reference edge 154 and a light forward flick to permit an ejection powered by the resilient spring 132.

The invention has been described in detail with reference to a presently preferred implementation thereof. It will be appreciated that variations and modifications may be made with the spirit and scope of the claimed invention. For example, while a module with four signal channels was described more or less may be used as a matter of engineering judgment.

What is claimed is:

1. For use in a matrix printer, a font storage module comprising:

a data storage device having at least one external communication port capable of transferring electrical signals, said storage device including stored information defining a set of printing patterns;

a generally rectangular housing enclosing said storage device, said housing having two generally parallel major surfaces that are spaced apart to define a first and a second set of relatively narrow opposing sides;

one of said major surfaces having defined therein a set of openings at which contact pads are located corresponding to said ports, said first set of sides including an insertion end surface which is opposite a side having a handle section said second set of opposing sides including at least one camming section that projects to define a rigid ramplike camming surface which terminates at one end in a surface that is sharply angled to said camming surface to define a latchable surface transition; and connection means for coupling said contact pads to said ports.

2. A font storage module according to claim 1 wherein said insertion end surface is perpendicular to said major surfaces and there are a plurality of said ports, said corresponding pads being arranged in a row parallel to said insertion end surface.

3. A font storage module according to claim 2 wherein said handle section is positioned between two similar camming sections and extends in a direction away from said insertion end section.

4. A font storage module according to claim 2 or 3 wherein said openings include sloped surfaces that define recesses for said pads.

5. A font storage module according to claim 2 wherein said insertion end surface is caused to be asymmetric by notches that extend to said opposite side.

6. A font storage module according to claim 4 wherein said camming surface(s) extend from said major surface including said opening and slope therefrom in a direction away from said insertion end surface.

7. For use in a printer, a receptacle for receiving a generally rectangular font module that includes at least one contact pad for establishing an electrical connection, said receptacle comprising:

an insertion section defined by generally parallel surfaces and having an insertion aperture at one end for initially receiving said module;

a leaf spring mounted to rise from an end of said insertion section opposite said insertion aperture to resist entry of said module;

a latching section slightly angled to said insertion section, which latching section includes hook means for retaining said module against the action of said spring, and contact means, arranged in said latching section, for engaging the contact pads of said module.

8. A receptacle according to claim 7 wherein said spring is arranged to act as a pivot, when compressed, for rotation of said module between said insertion section and said latching section.

9. For use in a matrix printer a cooperating font storage module-receptacle combination comprising:

a data storage device having at least one terminal for electrical signals, said storage device including retrievable information defining printing patterns;

a generally rectangular module housing enclosing said storage device, said housing having two flat generally coextensive surfaces that are spaced apart to include said storage device therebetween and are connected by a first and a second set of opposed sides;

one of said surfaces having defined therein a set of openings in which contact pads are located corresponding to said terminal(s);

said first set of sides including an insertion end surface which is opposite a side having a handle section and said second set of opposed sides having at least one projecting camming section that defines a rigid camming surface which terminates in a latchable surface transition;

means for electrically connecting said contact pads and said terminals; and a receptacle having multiple walls defining at least one cavity having an insertion section with an insertion aperture corresponding to the shape of said insertion end surface of said module housing, and a latching section that is angled to said insertion section, which latching section includes latching means for cooperating with said latchable surface transition to retain said module housing and contact means for engaging said contact pad(s) to make an electrical connection therewith.

10. A combination according to claim 9 wherein a spring is arranged in said insertion section at an end opposite said insertion aperture, said spring being compressed by insertion of said module housing and acting as a pivot for rotation of said module housing between said insertion section and said latching section.

11. A combination according to claim 10 wherein said latching means is a pair of hooks that engage corresponding latchable surface transitions on said module housing.

12. A combination according to claim 10 wherein said receptacle includes reference means for cooperating with said camming surfaces of said housing for moving said latchable surface transitions within said hooks incident to a rotation of said module housing between said insertion section and said latching section.

13. A combination according to claim 12 wherein the motion caused by said reference means compresses said spring to energize a reciprocating motion for causing a wiping action between said contact means and said contact pads.

14. A combination according to claim 9 wherein said openings are defined by sloped walls that provide a recess for said contact pads and said receptacle includes a cover section for said contact means, said handle section of said module housing having defined therein a notch which receives said cover section when said module housing is located in said latching section.

* * * * *